(12) United States Patent
Wanlass

(10) Patent No.: US 9,590,131 B2
(45) Date of Patent: Mar. 7, 2017

(54) SYSTEMS AND METHODS FOR ADVANCED ULTRA-HIGH-PERFORMANCE INP SOLAR CELLS

(71) Applicant: Alliance for Sustainable Energy, LLC, Golden, CO (US)

(72) Inventor: Mark Wanlass, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 338 days.

(21) Appl. No.: 14/226,540

(22) Filed: Mar. 26, 2014

(65) Prior Publication Data

US 2015/0280042 A1    Oct. 1, 2015

Related U.S. Application Data

(60) Provisional application No. 61/805,757, filed on Mar. 27, 2013.

(51) Int. Cl.
| | |
|---|---|
| *H01L 31/044* | (2014.01) |
| *H01L 31/18* | (2006.01) |
| *H01L 31/0304* | (2006.01) |
| *H01L 31/0693* | (2012.01) |
| *H01L 31/0735* | (2012.01) |

(52) U.S. Cl.
CPC ........ *H01L 31/184* (2013.01); *H01L 31/0304* (2013.01); *H01L 31/0693* (2013.01); *H01L 31/0735* (2013.01); *Y02E 10/50* (2013.01); *Y02P 70/521* (2015.11)

(58) Field of Classification Search
CPC ........ H01L 31/00–31/078; Y02E 10/50–10/60
USPC .................................. 136/243–265
See application file for complete search history.

(56) References Cited

U.S. PATENT DOCUMENTS

| | | |
|---|---|---|
| 3,900,868 A | 8/1975 | Bock et al. |
| 4,179,702 A | 12/1979 | Lamorte |
| 4,214,916 A | 7/1980 | Felsher et al. |

(Continued)

FOREIGN PATENT DOCUMENTS

| | | |
|---|---|---|
| JP | 11-163380 | 6/1999 |
| JP | 2003-347582 | 12/2003 |

(Continued)

OTHER PUBLICATIONS

Friedman et al., "30.2% Efficient GaInP/GaAs Monolithic Two-terminal Tandem Concentrator Cell", Progress in Photovoltaics: Research and Applications, vol. 3, 1955, pp. 47-50.

(Continued)

*Primary Examiner* — Bach Dinh
(74) *Attorney, Agent, or Firm* — Suzanne C. Walts

(57) ABSTRACT

Systems and Methods for Advanced Ultra-High-Performance InP Solar Cells are provided. In one embodiment, an InP photovoltaic device comprises: a p-n junction absorber layer comprising at least one InP layer; a front surface confinement layer; and a back surface confinement layer; wherein either the front surface confinement layer or the back surface confinement layer forms part of a High-Low (HL) doping architecture; and wherein either the front surface confinement layer or the back surface confinement layer forms part of a heterointerface system architecture.

13 Claims, 16 Drawing Sheets

(56) References Cited

U.S. PATENT DOCUMENTS

| | | |
|---|---|---|
| 4,255,211 A | 3/1981 | Fraas |
| 4,278,474 A | 7/1981 | Blakeslee et al. |
| 4,338,480 A | 7/1982 | Antypas et al. |
| 4,451,691 A | 5/1984 | Fraas |
| 4,575,576 A | 3/1986 | Ludowise |
| 4,575,577 A | 3/1986 | Fraas |
| 4,667,059 A | 5/1987 | Olson |
| 4,771,321 A | 9/1988 | Lewis |
| 4,881,979 A | 11/1989 | Lewis |
| 4,963,508 A | 10/1990 | Umeno et al. |
| 4,963,949 A | 10/1990 | Wanlass et al. |
| 5,009,719 A | 4/1991 | Yoshida |
| 5,019,177 A | 5/1991 | Wanlass |
| 5,053,083 A | 10/1991 | Sinton |
| 5,185,288 A | 2/1993 | Cook et al. |
| 5,223,043 A | 6/1993 | Olson et al. |
| 5,261,969 A | 11/1993 | Stanbery |
| 5,322,572 A | 6/1994 | Wanlass |
| 5,322,573 A | 6/1994 | Jain et al. |
| 5,376,185 A | 12/1994 | Wanlass |
| 5,407,491 A | 4/1995 | Freundlich et al. |
| 5,479,032 A | 12/1995 | Forrest et al. |
| 5,571,339 A | 11/1996 | Ringel et al. |
| 5,716,459 A | 2/1998 | Chang et al. |
| 5,853,497 A | 12/1998 | Lillington et al. |
| 5,865,906 A | 2/1999 | Ferguson et al. |
| 5,944,913 A | 8/1999 | Hou et al. |
| 6,034,321 A | 3/2000 | Jenkins |
| 6,107,562 A | 8/2000 | Hashimoto et al. |
| 6,150,604 A | 11/2000 | Freundlich et al. |
| 6,162,768 A | 12/2000 | Coolbaugh et al. |
| 6,162,987 A | 12/2000 | Murray et al. |
| 6,180,432 B1 | 1/2001 | Freeouf |
| 6,218,607 B1 | 4/2001 | Mulligan et al. |
| 6,239,354 B1 | 5/2001 | Wanlass |
| 6,252,287 B1 | 6/2001 | Kurtz et al. |
| 6,255,580 B1 | 7/2001 | Karam et al. |
| 6,265,653 B1 | 7/2001 | Haigh et al. |
| 6,281,426 B1 | 8/2001 | Olson et al. |
| 6,300,557 B1 | 10/2001 | Wanlass |
| 6,300,558 B1 | 10/2001 | Takamoto et al. |
| 6,316,715 B1 | 11/2001 | King et al. |
| 6,340,788 B1 | 1/2002 | King et al. |
| 6,420,732 B1 | 7/2002 | Kung et al. |
| 6,482,672 B1 | 11/2002 | Hoffman et al. |
| 6,660,928 B1 | 12/2003 | Patton et al. |
| 6,680,432 B2 | 1/2004 | Sharps et al. |
| 6,743,974 B2 | 6/2004 | Wada et al. |
| 6,815,736 B2 | 11/2004 | Mascarenhas |
| 6,917,061 B2 | 7/2005 | Pan et al. |
| 6,951,819 B2 | 10/2005 | Iles et al. |
| 7,095,050 B2 | 8/2006 | Wanlass et al. |
| 7,141,863 B1 | 11/2006 | Compaan et al. |
| 7,309,832 B2 | 12/2007 | Friedman et al. |
| 7,488,890 B2 | 2/2009 | Takamoto et al. |
| 7,675,077 B2 | 3/2010 | Shei et al. |
| 8,067,687 B2 | 11/2011 | Wanlass |
| 8,173,891 B2 | 5/2012 | Wanlass et al. |
| 2002/0062858 A1 | 5/2002 | Mowles |
| 2002/0144725 A1 | 10/2002 | Jordan et al. |
| 2003/0015700 A1 | 1/2003 | Eisenbeiser et al. |
| 2003/0160251 A1 | 8/2003 | Wanlass et al. |
| 2004/0206389 A1 | 10/2004 | Takamoto et al. |
| 2005/0150542 A1 | 7/2005 | Madan |
| 2005/0274411 A1 | 12/2005 | King et al. |
| 2006/0112986 A1 | 6/2006 | Atwater, Jr. et al. |
| 2006/0144435 A1 | 7/2006 | Wanlass |
| 2006/0162768 A1* | 7/2006 | Wanlass ............ H01L 31/06875 136/262 |
| 2006/0185582 A1 | 8/2006 | Atwater, Jr. et al. |
| 2007/0151595 A1 | 7/2007 | Chiou et al. |
| 2007/0277869 A1 | 12/2007 | Shan et al. |
| 2008/0149915 A1 | 6/2008 | Mori et al. |
| 2008/0200020 A1 | 8/2008 | Krull et al. |
| 2009/0078308 A1 | 3/2009 | Varghese et al. |
| 2009/0229659 A1 | 9/2009 | Wanlass et al. |
| 2009/0288703 A1 | 11/2009 | Stan et al. |
| 2010/0326496 A1* | 12/2010 | Bhattacharya .... H01L 31/03046 136/249 |
| 2011/0041904 A1 | 2/2011 | Kizilyalli et al. |
| 2011/0048519 A1 | 3/2011 | Kizilyalli et al. |
| 2011/0048532 A1 | 3/2011 | Kizilyalli et al. |
| 2011/0056546 A1 | 3/2011 | Kizilyalli et al. |
| 2011/0056553 A1 | 3/2011 | Kizilyalli et al. |
| 2011/0083722 A1 | 4/2011 | Atwater et al. |
| 2011/0186115 A1* | 8/2011 | Wanlass ............ H01L 31/06875 136/255 |
| 2012/0104460 A1 | 5/2012 | Nie et al. |
| 2012/0204942 A1 | 8/2012 | Nie et al. |
| 2012/0252159 A1 | 10/2012 | Nie et al. |
| 2012/0305059 A1 | 12/2012 | Kayes et al. |
| 2013/0263923 A1* | 10/2013 | Jones-Albertus ... H01L 31/0725 136/262 |
| 2014/0076386 A1* | 3/2014 | King ................. H01L 31/0725 136/255 |

FOREIGN PATENT DOCUMENTS

| | | |
|---|---|---|
| WO | 03/100868 | 12/2003 |
| WO | 2004/017425 | 2/2004 |
| WO | WO 2004022820 | 3/2004 |

OTHER PUBLICATIONS

Marti, et al, "Photon recycling and Shockley's diode equation," Journal of Applied Physics, vol. 82, Issue 8, Oct. 15, 1997, pp. 4067-4075.

Balenzategui, et al, "Detailed modelling of photon recycling: application to GaAs solar cells," Solar Energy Materials & Solar Cells, vol. 90, Issues 7-8, May 5, 2006, pp. 1068-1088.

Green, "Radiative efficiency of state-of-the-art photovoltaic," Progress in Photovoltaic: Research and Applications, vol. 20, Issue 4, Jun. 2012, pp. 472-476.

Miller, et al., "Stong Internal and External Luminescence as Solar Cells Approach the Shockley-Queisser Limit," IEEE Journal of Photovoltaics, vol. 2, No. 3, Jul. 2012, pp. 303-311.

Kayes, et al., "27.6% Conversion Efficiency, A New Record for Single-Junction Solar Cells Under 1 Sun Illumination," Photovoltaic Specialists Conference (PVSC), 2011 37th IEEE, Jun. 19-24, 2011, Seattle, WA, pp. 4-8.

Wanlass, et al., "An Empirical InvestigatiOn of the InP Shallow-Homojunction Solar Cell," Photovoltaic Specialists Conference, Conference Record of the Twentieth IEEE, Sep. 26-30, 1988, Lay Vegas, NV, pp. 491-460, vol. 1.

Keavney, et al., "Emitter Structures in MOCVD InP Solar Cells," Photovoltaic Specialists Conference, Conference Record of the Twenty First IEEE, May 21-25, 1990, Kissimmee, FL, pp. 141-194, vol. 1.

Shockley et al., "Detailed Balance Limit of Efficiency of p-n Junction Solar Cells," Journal of Applied Physics, vol. 32, No. 3, Mar. 1961, pp. 510-519.

International Search Report for PCT/US2009/032480 dated Nov. 19, 2009.

Written Opinion of the International Search Authority for PCT/US2009/032480 dated Nov. 15, 2010.

International Preliminary Report on Patentability for PCT/US2009/032480 dated Nov. 17, 2010.

Aiken, "Anti-reflection coating design for series interconnected multi-junction solar cells", Progress Photovoltaics: Research Applications, Nov./Dec. 2000, Vol, 8, No. 6, pp. 563-570.

Aiken, "High performance anti-reflection coatings for broadband multi-junction solar cells," Solar Energy Materials & Solar Cells, Nov. 2000, vol. 64, No., 4, pp. 393-404.

Lamorte, et al., "Computer Modeling of a Two-junction, Monolithic Cascade Solar Cell," IEEE Transactions on Electron Devices, Jan. 1980, vol. 27, Issue 1, pp. 231-249.

Wanlass, et al., "A Rigorous Analysis of Series-Connected, Multi-Bandgap, Tandem Thermophotovoltaic (TPV) Energy Converters,"

(56) References Cited

OTHER PUBLICATIONS

Proc. Sixth Conference on Thermophotovoltaic Generation of Electricity (TPV6), Jun. 14-16, 2004, pp. 462-470.
Wanlass, et al., "Lattice-Mismatched Approaches for High Performance, III-V Photovoltaic Energy Converters", 31st IEEE Photovoltaics Specialists Conference and Exhibition, Feb. 2005, pp. 1-6.
Wehrer, et al., "0.74/0.55-eV $Ga_xIn_{1-x}As/InAs_yP_{1-y}$ Monolithic, Tandem, MIM TPV Converters: Design, Growth, Processing and Performance," Proc. 29th IEEE Photovoltaic Spec. Conf., May 2002, pp. 884-887, New Orleans, LA.
Yablonovich, et al., "Extreme selectivity in the lift-off of epitaxial GaAs films", Applied Physics Letters, Dec. 28, 1987, vol. 51, No. 26, pp. 2222-2224.
Zahler, et al., "Wafer Bonding and Layer Transfer Processes for 4-Junction High Efficiency Solar Cells", Proceedings of the 29th IEEE Photovoltaic Specialists Conference, May 2002, pp. 1039-1042 New Orleans, LA.
International Search Report for International (PCT) Application No. PCT/US02/16101, mailed Sep. 6, 2002.
Written Opinion for International (PCT) Application No. PCT/US02/16101, mailed Apr. 6, 2004.
International Preliminary Examination Report for International (PCT) Application No. PCT/US02/16101, mailed Aug. 30, 2004.
Sinharoy et al., "Progress in the Development of Metamorphic Multi-junction III-V Space Solar Cells," Prog. Photovolt: Res. Appi., vol. 10, No. 6, Sep. 2002, pp. 427-432.
Venkatasubramanian et al., "An Inverted-Growth Approach to Development of an IR-Transparent, High-Efficiency AlGaAs/GaAs Cascade Solar Cell, " Conf. Record of the 22nd IEEE Phtovoltaic Specialists Conference, Oct. 7-11, 1991, pp. 93-98.
Liu et al., "Electrochemical performance of $\alpha$-Fe2O3 nanorods as anode material for lithium-ion cells," Electrochimica Acta, vol. 54, Issue 6, Feb. 2009, pp. 1733-1736.

\* cited by examiner

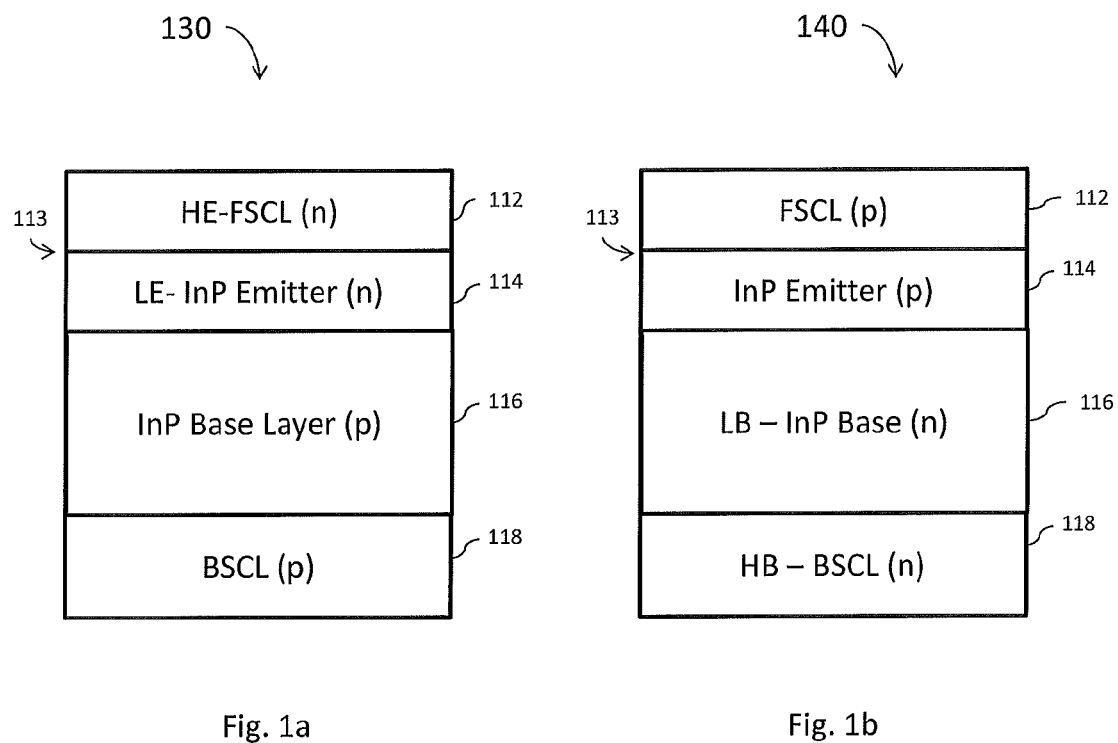

SYSTEMS AND METHODS FOR ADVANCED ULTRA-HIGH-PERFORMANCE INP SOLAR CELLS

CROSS-REFERENCES TO RELATED APPLICATIONS

This application claims priority to, and the benefit of, U.S. Provisional Patent Application No. 61/805,757, entitled "Systems and Methods for Advanced Ultra-High-Performance InP Solar Cells" filed on Mar. 27, 2013 which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

Crystalline indium phosphide (InP) is a technologically important III-V compound semiconductor for photovoltaic (PV) devices. For single-band-gap solar cells, it offers an optimal band gap for both space and terrestrial applications. It also has many important and useful characteristics for multi-band-gap PV systems. The inherently high resistance of InP to radiation damage gives it a special advantage for space applications. The interest in developing InP solar cell technology was very high for several years after the discovery of its high radiation resistance during the middle 1980s. However, despite its optimal band gap (1.35 eV at 300° K), the best PV performance of InP solar cells has historically been significantly less than that demonstrated for GaAs solar cells, which has a similar band gap (1.42 eV at 300° K). For example, under the standard global spectrum at one-sun intensity and at 25° C., the highest efficiency achieved for InP solar cells is ~22%, whereas for GaAs solar cells it is ~26% (note: these are efficiencies for conventional cells not employing back-surface reflectors (BSRs) and thin absorber layers to increase efficiency).

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In one embodiment, an InP photovoltaic device comprises: a p-n junction absorber layer comprising at least one InP layer; a front surface confinement layer; and a back surface confinement layer; wherein either the front surface confinement layer or the back surface confinement layer forms part of a High-Low (HL) doping architecture; and wherein either the front surface confinement layer or the back surface confinement layer forms part of a heterointerface system architecture.

In another embodiment, a method for producing an ultra-thin InP photovoltaic device comprises: providing a p-n junction comprising a base layer and an emitter layer, wherein one or both of the base layer and the emitter layer comprise InP semiconductor material; providing a front surface confinement layer coupled to the emitter layer and a back surface confinement layer coupled to the base layer, wherein either the front surface confinement layer or the back surface confinement layer form part of a High-Low (HL) doping architecture, and wherein either the front surface confinement layer or the back surface confinement layer form part of a heterointerface system architecture; and depositing a back surface reflector layer onto at least a portion of a back surface of the back surface confinement layer.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

FIGS. 1, 1a and 1b are a block diagrams illustrating general schematic structures for InP solar cell example embodiments of the present disclosure.

DETAILED DESCRIPTION

Figure 1:
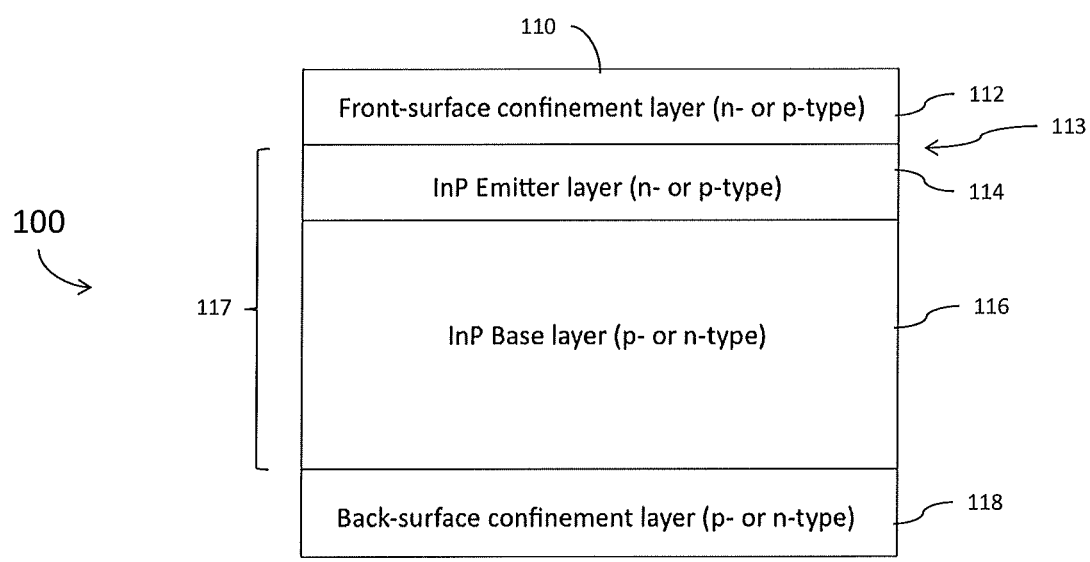

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments of the present disclosure describe novel approaches for InP solar cells with dual minority-carrier confinement schemes. By implementing embodiments described herein, InP solar cells have been realized with PV efficiencies confirmed by the National Renewable Energy Laboratory (NREL) that constitute new world records and rival those of the best conventional GaAs cells. Variations providing additional embodiments are also described. The embodiments for InP solar calls described herein represent a significant leap in the PV performance of InP solar cells and have moved their performance close to the practical limit for cells not employing photon-confinement techniques (i.e., conventional cells). Other variations on the basic embodiments are also described herein and are explicitly contemplated as falling within the scope of embodiments described by this disclosure. For example, additional embodiments include InP solar cells incorporating the addition of a back-surface reflector (BSR) system to an ultra-thin cell structure (that is, a cell structure where the original parent growth substrate (commercially available, virtual, or otherwise) upon which the cell structure was grown has been removed leaving only the layers that contribute to the functionality of the solar cell) to improve the performance of the cell even further by reducing the escape of photons generated by radiative recombination within the cell layers. The generation and re-absorption of photons created by radiative recombination of minority carriers is often referred to as photon recycling. Moreover, by implementing a BSR and other possible optical confinement techniques (e.g., surface texturing) to allow extremely thin cells, one-sun PV conversion efficiencies exceeding 30% may now be achievable.

As reference is made throughout this disclosure to semiconductor layers comprising InP, it should be understood that in addition to the term "InP" referring to purely binary InP layers, it also refers to InP material layers that may comprise a pseudo-binary alloy of InP containing up to approximately 5% of other III-IV elements. Accordingly, small amounts of Boron (B), Nitrogen (N), Aluminum (Al), Phosphorous (P), Gallium (Ga), Arsenic (As), Antimony (Sb), Indium (In), Thallium (Tl) and Bismuth (B) may also be present in the InP absorber layer 117 with appropriate compositional adjustments to other layers contained in the cell structure. For example, when growing bulk InP boules (which are often sliced into bulk InP wafers), isoelectronic doping can be used to add a very small amount of Ga which has the effect of significantly hardening the material and aids in the suppressing the formation of dislocations in the boules. The amount of Ga added is on the order of 0.1% of Ga. However, the resulting boule would still be referred to by those knowledgeable and of ordinary skill in the art as an InP boule even though it includes a small amount of Ga. The added Ga barely changes either the lattice constant of the material or the band gap of the material, although it does improve its mechanical properties and reduces dislocation resulting in a much higher quality InP boule. Such addition of III-IV elements as described above generally constitutes only a minor deviation from, and does not adversely affect results obtained by, the embodiments of the present disclosure as described below.

FIG. 1 illustrates a general schematic structure for an InP solar cell 100 of one embodiment of the present disclosure implementing dual minority-carrier confinement schemes. In the particular implementation shown, InP solar cell 100 is an InP homojunction solar cell. However, in other implementations, InP solar cell 100 may comprise other junction structures such as a heterojunction. Further, as illustrated in subsequent figures of this disclosure, additional layers from those shown may be included in the cell 100's structure to help implement processing-related and operational aspects of the technology including, for example, front- and/or back-surface metallizations for electrical contacts, anti-reflection coating layers, contact layers, and etch-stop layers. FIG. 1, however, is presented to focus the immediate discussion on the component layers involved in the energy conversion process internal to the cell 100. By convention in this disclosure, the side of a solar cell where sunlight enters is designated as the "front" of the solar cell with the opposing side of the solar cell designated the "back." Accordingly, for InP solar cell 100 of FIG. 1, sunlight enters at front surface 110. InP solar cell 100 further comprises an InP base 116 and InP emitter 114 layers, which in combination constitute the optical absorber layer 117 for the cell 100. Since the bulk quality of InP epitaxial layers is extremely high, an important step toward virtually eliminating non-radiative recombination lies in developing a suitable front-surface minority-carrier confinement layer 112 and back-surface minority-carrier confinement layer 118 for the cell 100 structure. Front-surface confinement layer 112 (often referred to as a "window layer") is highly transparent to solar radiation. Options for the confinement layers 112 and 118 are discussed in the following two sections of this disclosure. Note that the generalized structure of cell 100 shown in FIG. 1 allows for either n-on-p or p-on-n doping architectures, as illustrated in FIGS. 1a and 1b. The carrier confinement schemes for n-InP and p-InP described below then apply accordingly.

Minority-Carrier Confinement Options for n-InP

The minority carriers in n-type InP are holes and therefore require a sufficient valence-band barrier (that is, several kT) to affect confinement to the n-InP layers. Unfortunately, a lattice-matched, heterointerface barrier option is not readily available for n-InP. Fortuitously, however, the ability to create a high-low (HL) doping architecture to affect hole confinement is possible, as described below. The HL doping approach can be used to affect a front-surface confinement layer (FSCL) 112 for an n-on-p InP cell (such as shown at 130 in FIG. 1a), or as a back-surface confinement layer (BSCL) 118 for a p-on-n InP cell (such as shown at 140 in FIG. 1b).

For utilizing HL doping for InP cell 130, the FSCL 112 is a highly doped surface layer (HE) formed as thin as possible to minimize parasitic absorption losses while still being thick enough to provide adequate hole confinement. For utilizing HL doping for InP cell 140, the BSCL 118 is a highly doped base (HB) layer 118. BSCL 118 generally can be thicker, but other design considerations, such as implementation of a back-surface reflector (BSR, discussed below), may influence its optimal thickness.

As an example, consider creating an HL doping system shown in FIG. 1a for the emitter layer 114 at the surface of the n-on-p InP cell structure 130. The design philosophy for using an HL doping architecture is to create a potential barrier near the emitter surface 113 to confine photogenerated minority holes (that is, to dramatically reduce the surface recombination velocity). In this example, a heavily doped surface layer serves as the FSCL 112. A potential barrier occurs between the very heavily doped emitter (HE) surface layer for FSCL 112 and an underlying lightly doped emitter (LE) layer 114.

Figure 2A:
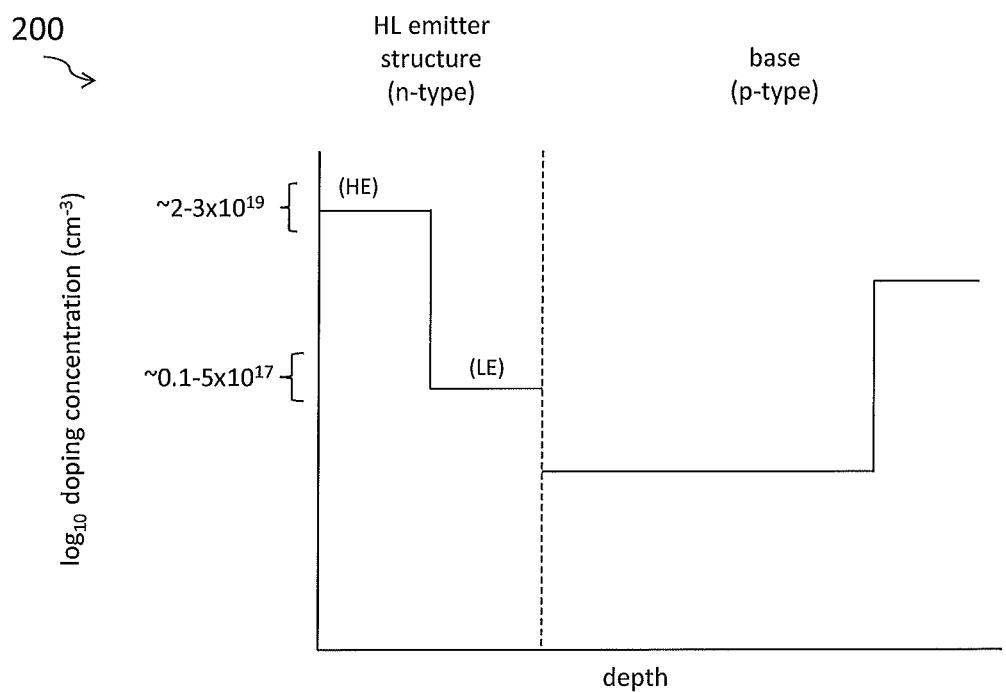
FIG. 2a is a schematic graph generally illustrating a High-Low (HL) doping architecture.

FIG. 2a provides a schematic not-to-scale illustration of HL doping levels in an n-InP emitter structure. In one embodiment, such as illustrated by FIG. 2a, a confinement layer has been realized by doping the HE layer 112 degenerately (for example, in the range of $2\text{-}3 \times 10^{19}$ cm$^{-3}$) and the LE layer 114 lightly to moderately (for example, in the range of $0.1\text{-}5 \times 10^{17}$ cm$^{-3}$). Electrons in InP have a low effective mass ratio (approximately 0.077), which means that it is possible to affect a large Moss-Burstein shift with degenerate donor doping. For example, at room temperature, the effective optical gap of InP doped to $2\text{-}3 \times 10^{19}$ cm$^{-3}$ with S is 1.55 eV, which is 0.2 eV (nearly 8 kT) higher than the band gap for undoped InP (1.35 eV). Thus, significant band bending occurs between the HE 112 and LE 114 layers of structure 130 and the desired potential barrier is formed. Also, the large Moss-Burstein shift increases the optical transparency of the HE layer, thus reducing parasitic absorption losses somewhat. The HE layer 112 is thick enough to attenuate the hole wave function significantly near the surface, but as thin as possible so as to minimize parasitic light absorption. Most of the minority holes generated in the HE layer 112 will recombine quickly and non-radiatively due to Auger recombination in the bulk InP and recombination at the surface. In preliminary laboratory work, HE layers that are 7 nm thick have been used with good success, but thinner layers may also work and may provide additional performance improvement.

Further, we have leveraged our ability to dope the HE layer 112 to a very high level with sulfur (S), which has not been demonstrated previously, and which causes the large Moss-Burstein shift mentioned previously. The LE layer 114 may also be doped to lower levels to enhance the resulting HL barrier height to improve carrier confinement. Furthermore, as further discussed below the recombination rate is radiatively dominated in the more lightly doped LE layer 114, which improves both the open-circuit voltage ($V_{oc}$) and the minority hole collection. The longer lifetime, enhanced diffusion length, and increased depletion width in the more lightly doped LE layer 114 all work together to improve conversion efficiency.

Figure 2B:
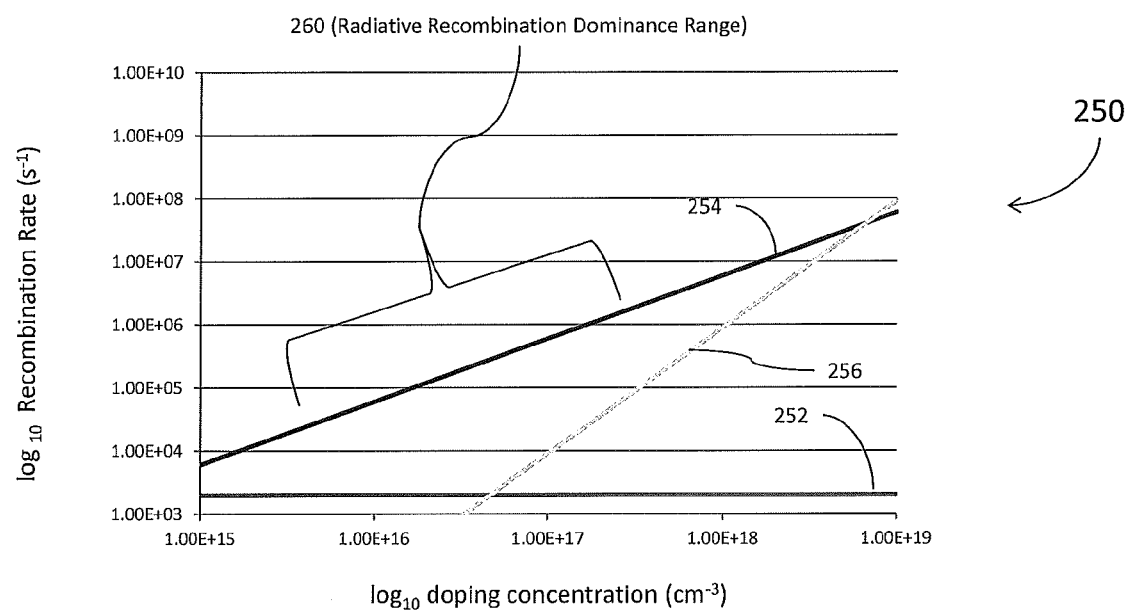
FIG. 2b is a graph generally illustrating radiative recombination dominance for an example embodiment of the present disclosure.

FIG. 2b provides a graph, generally at 250, illustrating three components that contribute to the total recombination rate as a function of the doping concentration within the lightly doped layer (LE or LB) of an HL doping architecture. The three components include the defect-related recombination rate (shown by 252), the radiative recombination rate (shown by 254) and the Auger recombination rate (shown by 256). Total recombination rate (r) can be expressed by the equation:

$$r = A + Bn/f + Cn^2$$

where n is the doping concentration, A is a constant coefficient for defect-related recombination rate (i.e., the defect-related, non-radiative recombination rate in aggregate (bulk+surfaces+interfaces), B is the coefficient for the radiative recombination rate, and C is the coefficient for the Auger recombination rate. The coefficient, f, is the photon recycling factor (which depends on cell structure architecture, but typically varies between 5 and 10 without a BSR present and may range between 10 and 20 with a BSR). For the data presented in FIG. 2b, f is equal to 20. Radiative dominance occurs within a range of doping concentrations (illustrated at 260) where the radiative recombination rate 254 dominates over the defect-related recombination rate 252 and the Auger recombination rate 256. More specifically, the recombination rate is considered to be radiatively dominated in the range of doping concentrations where the radiative recombination rate 254 is at least a factor of 10 greater than the defect-related recombination rate 252 and at least a factor of 10 greater than the Auger recombination rate 256.

As evident by FIG. 2b, the defect-related recombination rate 252 is relatively independent of the doping concentration. Further, the range 260 where the radiative recombination rate 254 dominates can be appreciably expanded by increasing the quality of (that is, decreasing the defects within) the InP material, which serves to lower the defect-related recombination rate 252. Table 1 provides example radiative and Auger minority-carrier recombination rates for InP as a function of the doping concentration and the photon-recycling factor for $B = 1.2 \times 10^{-10}$ cm$^3$/s, $C \sim 9 \times 10^{-31}$ cm$^6$/s, and photon recycling factors (f) of 10 and 20.

TABLE 1

| n (cm$^{-3}$) | n$^2$ (cm$^{-6}$) | Bn (s$^{-1}$) | Bn/10 (s$^{-1}$) | Bn/20 (s$^{-1}$) | Cn$^2$ (s$^{-1}$) | Bn/20Cn$^2$ |
|---|---|---|---|---|---|---|
| $1 \times 10^{15}$ | $1 \times 10^{30}$ | $1.2 \times 10^5$ | $1.2 \times 10^4$ | $6 \times 10^3$ | $9 \times 10^{-1}$ | $6.7 \times 10^3$ |
| $3 \times 10^{15}$ | $9 \times 10^{30}$ | $3.6 \times 10^5$ | $3.6 \times 10^4$ | $1.8 \times 10^4$ | 8.1 | $2.2 \times 10^3$ |
| $1 \times 10^{16}$ | $1 \times 10^{32}$ | $1.2 \times 10^6$ | $1.2 \times 10^5$ | $6 \times 10^4$ | $9 \times 10^1$ | $6.7 \times 10^2$ |
| $3 \times 10^{16}$ | $9 \times 10^{32}$ | $3.6 \times 10^6$ | $3.6 \times 10^5$ | $1.8 \times 10^5$ | $8.1 \times 10^2$ | $2.2 \times 10^2$ |
| $1 \times 10^{17}$ | $1 \times 10^{34}$ | $1.2 \times 10^7$ | $1.2 \times 10^6$ | $6 \times 10^5$ | $9 \times 10^3$ | $6.7 \times 10^1$ |
| $3 \times 10^{17}$ | $9 \times 10^{34}$ | $3.6 \times 10^7$ | $3.6 \times 10^6$ | $1.8 \times 10^6$ | $8.1 \times 10^4$ | $2.2 \times 10^1$ |
| $1 \times 10^{18}$ | $1 \times 10^{36}$ | $1.2 \times 10^8$ | $1.2 \times 10^7$ | $6 \times 10^6$ | $9 \times 10^5$ | 6.7 |
| $3 \times 10^{18}$ | $9 \times 10^{36}$ | $3.6 \times 10^8$ | $3.6 \times 10^7$ | $1.8 \times 10^7$ | $8.1 \times 10^6$ | 2.2 |
| $1 \times 10^{19}$ | $1 \times 10^{38}$ | $1.2 \times 10^9$ | $1.2 \times 10^8$ | $6 \times 10^7$ | $9 \times 10^7$ | 0.67 |

In the same manner, for the n-InP Base layers 116 and 118 of the cell structure shown at 140 in FIG. 1b, doping HB layer 118 to a very high level with S, with an LB layer 116 doped to lower levels, enhances the resulting HL barrier height for a BSCL to improve carrier confinement.

With the embodiments presented herein, the HL doping system implemented for n-type InP regions is characterized as having a more lightly doped n-InP layer (e.g., either the lightly doped emitter LE layer 114 in structure 130 or the lightly doped base LB layer 116 in structure 140) where the recombination rate is radiatively dominated.

For this particular example, these calculations show that the doping concentration (n) may be kept below a mid-$10^{17}$ cm$^{-3}$ value for the recombination process to be highly radiatively dominated. For example, the last column of Table 1 illustrates the ratio of Bn to Cn$^2$ given a photon recycling factor (f) of 20. At a doping concentration of $1 \times 10^{19}$ cm$^{-3}$, the ratio is less than one meaning that the Auger recombination rate actually exceeds the radiative recombination rate. At doping concentrations of $3 \times 10^{18}$ cm$^{-3}$ and $1 \times 10^{18}$ cm$^{-3}$, the ratios are 2.2 and 6.7 respectively, indicating that the radiative recombination rate exceeds the Auger recombination rate, but does not really dominate the recombination process. However, at a doping concentration of $1\times10^{17}$ cm$^{-3}$ and less, the ratio grows to a value of 10 or more such that the recombination rate can be said to be radiatively dominated. Calculations also show that, for reasonably thin (~0.1-0.3 μm) LE layers, the conductivity and sheet resistance of the HE/LE emitter system is dominated by the properties of the HE layer due to its heavy degenerate doping. Thus, the thickness of the LE layer can be varied substantially with little consequence in this regard. In addition, the performance of the HE layer may be improved by adding small amounts of Al and/or Ga to increase its transparency and by grading the doping from high to low toward the junction to improve carrier collection.

The HL doping architecture is ideal in that it simultaneously provides minority-carrier confinement while producing no barrier to majority-carrier current flow out of the HL layer system.

Minority-Carrier Confinement Options for p-InP

The minority carriers in p-type InP are electrons and therefore require a sufficient conduction-band barrier (that is, several kT) to affect confinement to the p-InP. Unfortunately, the HL doping architecture approach such as discussed above for n-type InP for carrier confinement is difficult to implement in the case of p-type InP because the heavy hole effective mass ratio for InP along (100) is 0.56, making it difficult to affect significant valence band state filling even with heavy degenerate p-doping. Furthermore, degenerate p-doping is often difficult to achieve in InP. For example, with Metal Organic Vapor Phase Epitaxy (MOVPE) p-doping is limited to a range of $3-4\times10^{18}$ cm$^{-3}$ using Zn as the acceptor. However, and fortuitously, this disclosure presents options to HL doping for producing conduction band barriers for p-type InP. For example, in some embodiments, conduction band barriers for p-type InP may be formed using a heterointerface system.

More specifically, the lattice-matched pairs GaAsSb/InP, AlAsSb/InP, AlGaAsSb/InP, AlInAs/InP, AlInAsSb/InP, and some compositions of AlGaInAsSb/InP, along with GaPSb/InP, AlPSb/InP, and AlGaPSb/InP, all form significant positive conduction-band offsets (that is, type-II, staggered band alignment) with respect to InP, thus affecting electron confinement for p-InP. For example, the generalized lattice-matched alloy AlGaInSbAsP with a sufficiently high conduction band offset (at least several kT) is one innovation provided by this disclosure for either a front-surface or back surface confinement layer for p-InP. In fact, the type-II offset with p-InP acts much like the HL doping barrier for n-InP in that it provides an efficient barrier for minority carriers, but allows majority carriers to flow out easily. The thickness of the confinement layer should at least be sufficient to prevent electrons from tunneling through. The p-InP layer thickness can range widely (~0.1-10 μm, for example) depending on the position of the p-n junction and whether any optical confinement schemes are implemented. The p-InP layer doping level is light to moderate (~0.1-5$\times10^{17}$ cm$^{-3}$) such that the recombination rate is radiatively dominated.

The heterointerface confinement may be further enhanced for p-InP by having FSCL and BSCL compositions that are graded (linearly, stepped, or otherwise) to create band gap gradients that force carriers toward the p-n junction. Also lattice-mismatched, pseudomorphic FSCLs with band gaps higher than the lattice-matched composition can be used to increase the FSCL transparency.

In addition to the confinement layers discussed above, there are other advancements provided by the InP solar cell embodiments disclosed herein. For example, embodiments of the present disclosure provide alternate epilayer growth sequences on the InP parent substrate. That is, cell structures such as illustrated in FIGS. 1, 1a and 1b can be grown upright by first depositing back layers and then progressing to the front layers. This is often referred to as the "normal" growth sequence for forming a solar cell structure on a substrate. Alternatively, the growth sequence can be reversed (referred to as an "inverted" growth sequence) by starting deposition with layers that will form the front layers of the cell and progressing to back layers. Use of an inverted sequence for producing an InP solar cell may be advantageous for several reasons.

In one embodiment, forming the InP solar cell using an inverted sequence permits selective removal of the parent growth substrate which results in embodiments comprising ultra-thin solar cells. As mentioned above, the term ultra-thin solar cells, as opposed to referring directly to a solar cell's thickness, instead refers to a solar cell where the parent growth substrate has been removed so that just those layers involved in the functionality of the solar cell remain. For some embodiments, such ultra-thin cells may also be mounted onto an engineered carrier (or "handle") to affect an electrical contact, mechanical robustness, matched or desired thermal expansion properties, a BSR and light trapping, ultra-lightweight cells, and flexible cells, and other possible desired electrical, mechanical, thermal, optical, etc. properties. In other embodiments, a BSR, such as described below, or other support device may provide mechanical support to the remaining layers forming the ultra-thin cell.

Using an inverted sequence also facilitates implementation of epitaxial liftoff (ELO) for cost reduction through multiple uses of the parent growth substrate. That is, epitaxial liftoff permits a non-destructive separation of the parent growth substrate from the ultra-thin solar cell so that the parent growth substrate may be reused in the production of additional solar cells. It is implicit that both ultra-thin solar cells and ELO of the parent growth substrate may also be achieved with an upright growth sequence, and such implementations for forming an InP solar cell are considered within the scope of the present disclosure. But it should be noted that such implementations would require more layer transfer steps, thereby making such a process more complicated and costly as compared to an inverted growth process. Lattice-matched AlAsSb, AlPSb, and AlNSb are examples of materials that could be used as separation (liftoff) layers that are selectively dissolved to separate the InP parent grown substrate from the epitaxial cell structure layers.

Figure 3:
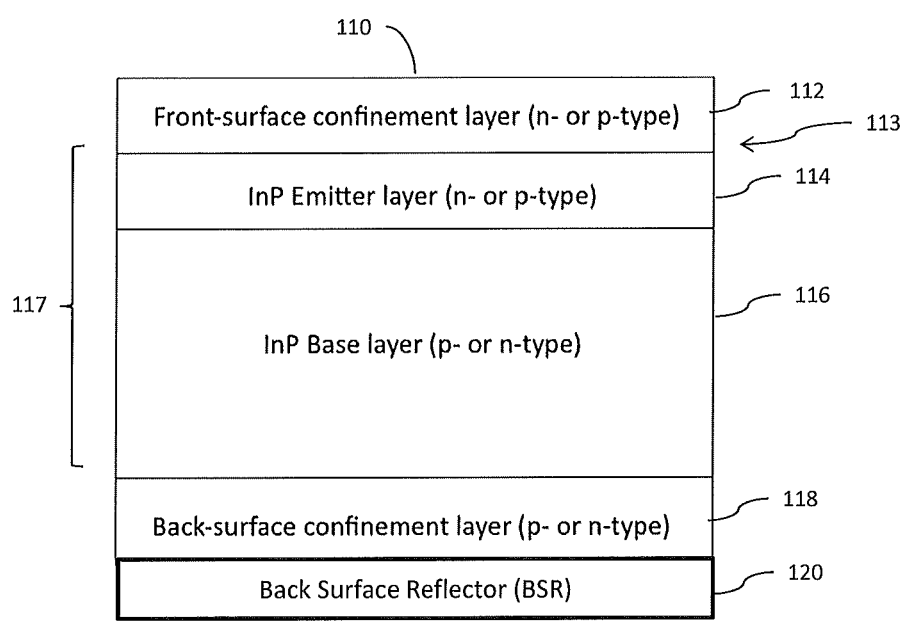
FIG. 3 is a block diagram illustrating a general schematic structure for an InP solar cell of an example embodiment of the present disclosure.

In other embodiments, additional optical confinement schemes may be used with InP solar cell 100 in order to increase the conversion efficiency of the cell. For example, the addition of a BSR 120 layer onto the back surface of the BSCL 118 of InP solar cell 110 is shown in FIG. 3. In such an embodiment, the parent growth substrate has been removed from the cell structure. The BSR 120 layer may also further include surface texturing. Utilization of a BSR 120 layer, either with, or without surface texturing of the BSR 120, as well as other possible optical confinement techniques can be optionally included with the various embodiments of InP solar cell 100 resulting in extremely thin cells and significant performance improvements. Optical confinement, such as provided by BSR 120, is advantageous in the following ways. First, internal radiative recombination produces photon recycling, which should be maintained until minority carriers are collected in order to achieve maximum conversion efficiency. An efficient BSR 120 layer either with, or without, surface texturing can result in efficient photon recycling. Second, a BSR 120 layer on its own can be used to reduce the cell absorber layer 117 thickness by a factor of 2, resulting in a gain of ~20 mV in the open-circuit voltage ($V_{oc}$) of InP solar cell 110. The combination of a BSR 120 layer with surface texturing to affect light trapping can be used to reduce the absorber layer 117 thickness even further resulting in additional gains in $V_{oc}$. These gains in $V_{oc}$ result from long bulk diffusion lengths (which are many times the absorber layer 117 thickness) and extremely low interface recombination velocities provided by the minority-carrier confinement schemes used in the FSCL 112 and BSCL 118.

In one embodiment, possible options for the BSR 120 layer design include a hybrid multi-layer-dielectric/metal reflector (such as Ag, for example), an omnidirectional reflector (ODR) consisting of a dielectric layer plus a metal layer (such as Ag, for example), or a broad-band, high-low index distributed Bragg reflector (DBR) with high reflectance. In other embodiments, other design approaches for the BSR 120 layer can be utilized. In any case, the modeled design of the BSR 120 layer should ideally be optimized for the particular cell structure that it is being applied to.

The absorber layer 117 thicknesses can vary over a broad range (e.g., ~0.1-10 µm) depending on the degree of optical confinement that is employed in the completed cell. It should also be noted that the metallurgical p-n junction position can occur virtually anywhere within the cell 110 structure and may even fall outside of the absorber layer 117. That is, when a solar cell is created where the radiative recombination rate dominates in both the p-InP layer and the low doped n-InP layer, the photogenerated minority carriers produced are highly likely to recombine radiatively. If the carriers are not collected quickly enough, a photon will emerge within the material. The photon will travel in an arbitrary direction and either be re-absorbed to create another election-hole pair within the cell, or it will escape the cell and its energy is lost. One function of a BSR 120 is to mitigate that loss by reflecting such photons back into the cell. Additionally, when the recombination rate in InP layers is radiatively dominated, the diffusion length of the carriers becomes extremely long so that the p-n junction may be positioned nearly anywhere in the cell structure and the carriers will still be collected.

Additionally, anti-reflection coatings (ARCs) may be incorporated into any of the embodiments described herein. For example, bilayer, high-performance dielectric ARC systems such as, but not limited to, $ZnS/MgF_2$, $TiO_2/MgF_2$, $TiO_2/Al_2O_3$, may be utilized, and more complex multi-layer ARCs may improve performance even further.

With respect to electrical contacting schemes, many options exist for fabricating electrical contacts for embodiments of the present disclosure. Such options include, but are not limited to: front grid metallization combined with a planar back contact; having both base and emitter contacts formed on the front side of the solar cell, where the back contact is electrically coupled to a position behind the p-n junction of the solar cell (this option would work well for cells having a BSR since the reflector and back contact functions can be physically separated); front grid metallization combined with a BSR and back contact that share the back surface; and having both contacts formed on the back surface of the solar cell. In this last implementation, point-contact schemes may be used to access positions above the p-n junction to make the front contact. This approach can improve performance by eliminating metallization obscuration on the front surface.

Figure 4A:
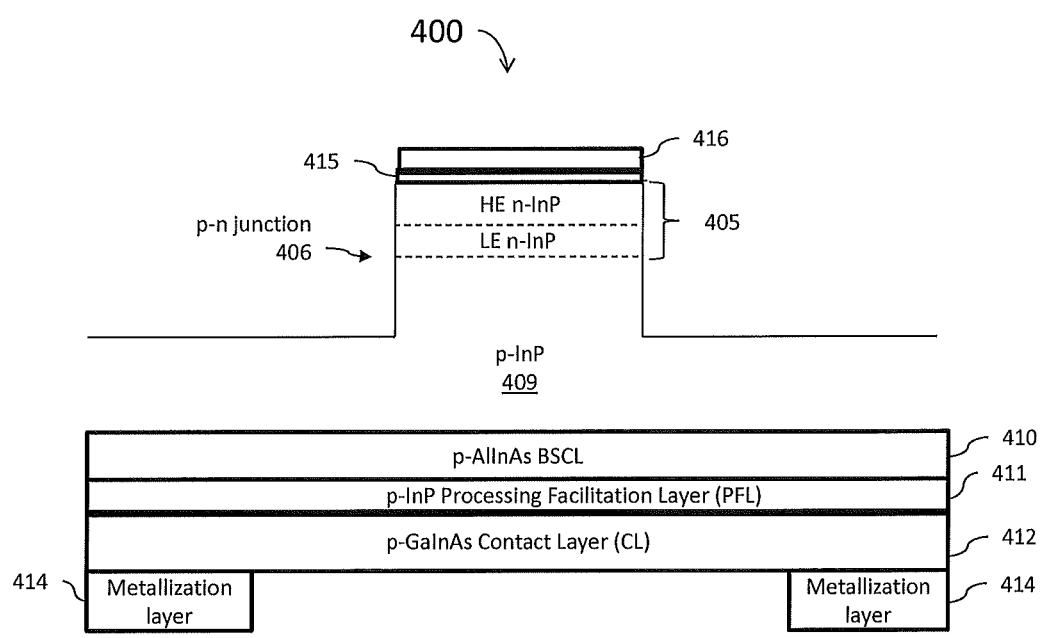
FIGS. 4a and 4b are block diagrams illustrating general schematic structures for InP solar cell example embodiments of the present disclosure.
Figure 4B:
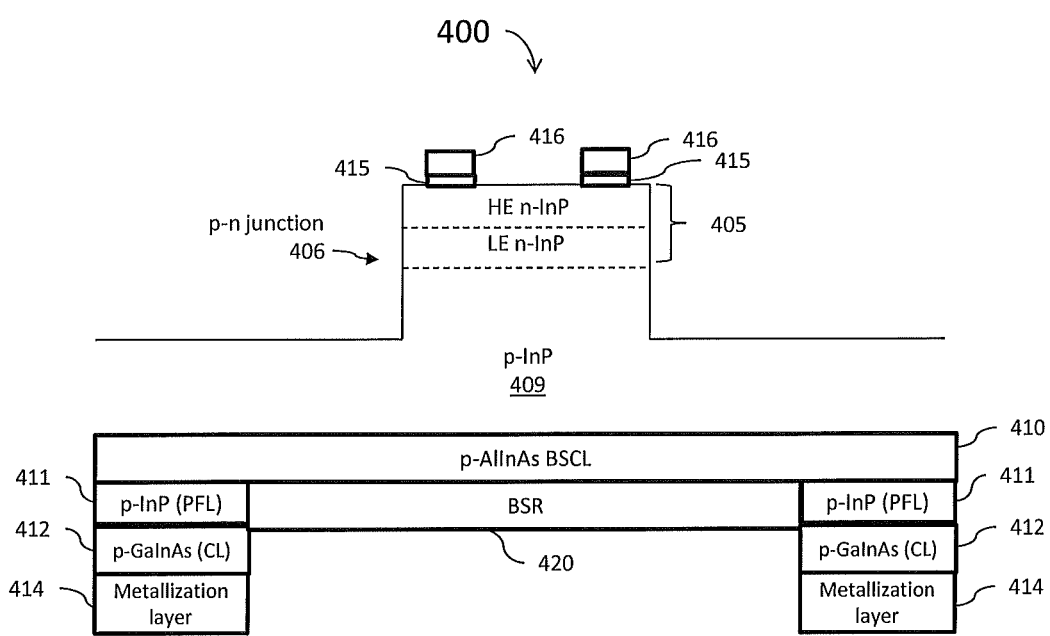

FIGS. 4a and 4b are diagrams illustrating an example structure for an embodiment of a dual confined p-n junction device 400. The dually confined p-n junction device 400 includes a High-Low (HL) doping architecture implemented as a front surface confinement system in the emitter region 405 and a heterointerface system architecture implemented using a back surface confinement layer 410. In this example embodiment, p-n junction 406 comprises an n-InP emitter region 405 and a p-InP base region 409 with the BSCL 410 implemented using lattice-matched p-AlInAsNote that device 400 has been processed for selective substrate removal to create an ultra-thin cell structure such as described above.

In the embodiment shown in FIGS. 4a and 4b, a contact layer 412 (CL) is epitaxially grown onto the BSCL 410. For this example embodiment, the CL layer 412 comprises a heavily doped p-GaInAs contact layer. In other embodiments, other semiconductor materials may be grown onto BSCL 410 in order to facilitate formation of an ohmic contact. Metallization layer 414 may then be selectively applied as a pattern of single-layer metallization or multi-metallization layers to affect an ohmic electrical contact.

The lattice matched GaInAs material used for CL 412 has a relatively low bandgap (0.74 eV at 300° K) and is largely opaque to the photon wavelengths within device 400. As such, forming a BSR directly onto CL 412 would limit the efficiency of the BSR because the BSR could not reflect back into device 400 that portion of light absorbed by CL 412. For this reason, as illustrated in FIG. 4b, the CL 412 layer is etched away in those locations where BSR 420 is to be applied. To facilitate processing, one or more conductive intermediate processing facilitation layers (PFL) 411 may be utilized (such as a selective stop-etch layer, for example), to permit for selective removal of portions of the contact layer 412, and portions of PFL 411 where a BSR 420 is to be applied to the BSCL 410.

Figure 4C:
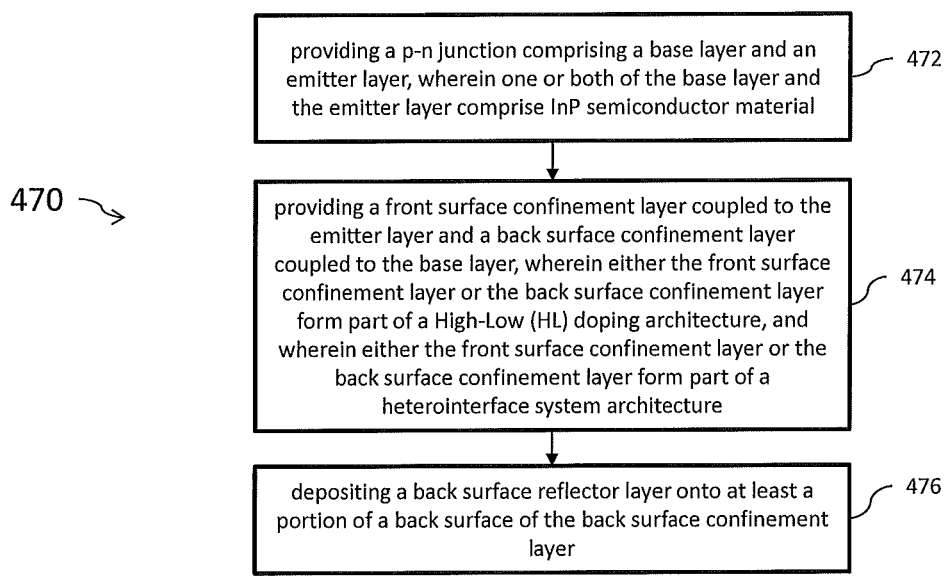
FIGS. 4c and 4d are flow charts illustrating method embodiments of the present disclosure.

For example, in one embodiment a method 470 for producing an ultra-thin InP photovoltaic device (such as device 400) is illustrated in FIG. 4c. The method begins at 472 with providing a p-n junction comprising a base layer and an emitter layer, wherein one or both of the base layer and the emitter layer comprise InP semiconductor material. As discussed throughout this disclosure, the p-n junction may comprise, for example, a homojunction where both the base and emitter layers comprise InP semiconductor material, or a heterojunction where the base or emitter layers comprise different semiconductor materials from each other. Further, the p-n junction may be either an n-on-p junction (such as illustrated in FIG. 1a) or a p-on-n junction (such as illustrated in FIG. 1b).

The method proceeds to 474 with providing a front surface confinement layer coupled to the emitter layer and a back surface confinement layer coupled to the base layer, wherein either the front surface confinement layer or the back surface confinement layer form part of a High-Low (HL) doping architecture, and wherein either the front surface confinement layer or the back surface confinement layer form part of a heterointerface system architecture.

In one embodiment, the High-Low (HL) doping architecture comprises a first n-type InP layer that is more lightly doped than a second n-type InP layer that interfaces with the first n-type InP layer. Further, the recombination rate is radiatively dominated in the first n-type InP layer and the second n-type InP layer is doped degenerately. When the HL doping architecture is formed at the front surface of an n-InP emitter, then it forms the front surface confinement layer. When the HL doping architecture is formed at the back surface of an n-InP base, then it forms the back surface confinement layer.

In one embodiment, the heterointerface system architecture includes a layer that interfaces with a p-InP layer of the p-n junction. When the heterointerface system architecture is formed at the front surface of a p-InP emitter, then it forms the front surface confinement layer. When the heterointerface system architecture is formed at the back surface of a p-InP base, then it forms the back surface confinement layer. In alternative embodiments, the heterointerface system architecture may comprise a layer of GaAsSb, AlAsSb, AlGaAsSb, AlInAs, AlInAsSb, AlGaInAsSb, GaPSb, AlPSb, or AlGaPSb material interfacing with a p-InP layer of the p-n junction.

The process then proceeds to 476 depositing a back surface reflector layer onto at least a portion of a back surface of the back surface confinement layer. As discussed herein, the addition of a back-surface reflector (BSR) system to an ultra-thin cell structure improves the performance of the ultra-thin cell by mitigating the escape of photons generated by radiative recombination within the cell layers. The generation and re-absorption of photons created by radiative recombination of minority carriers is often referred to as photon recycling. The cell structures illustrated in FIGS. 4a and 4b is considered an ultra-thin cell because the original parent growth substrate upon which the structure was grown is no longer present. It has been removed leaving only the layers that contribute to the functionality of the solar cell.

Figure 4D:
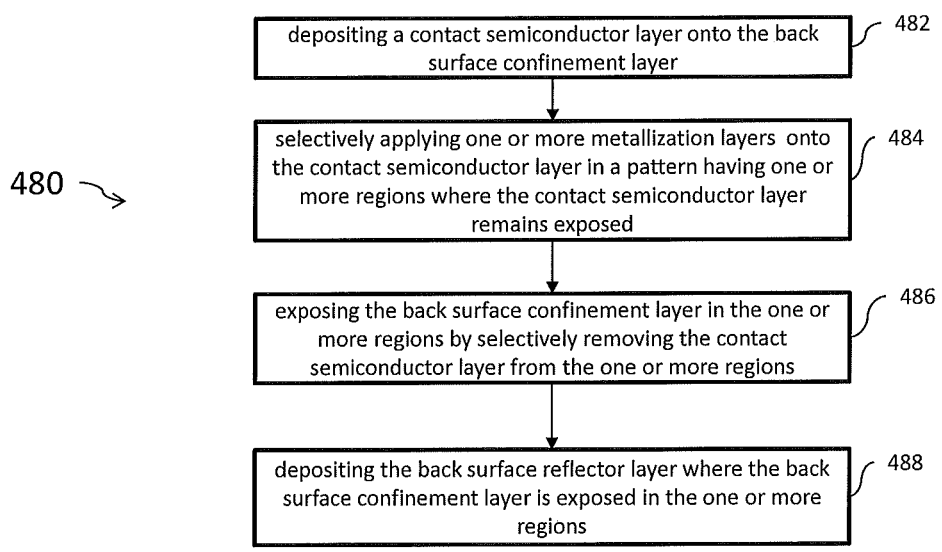

In one embodiment, depositing the back surface reflector layer at block 476 further comprises a method 480 such as shown in FIG. 4d. In such an embodiment, method 480 begins at 482 with depositing a contact semiconductor layer onto the back surface confinement layer. Contact layer 412, described above, is one such contact semiconductor layer. The method proceeds to 484 with selectively applying one or more metallization layers (such as layer 414) onto the contact semiconductor layer in a pattern having one or more regions where the contact semiconductor layer remains exposed. In one embodiment, application of the one or more metallization layers results in an array of conductive points coupled to the BSCL via the contact semiconductor layer. As mentioned above, the contact semiconductor layer will be largely opaque, preventing the back surface reflector from efficiently reflecting photons back into the absorber layer of the cell. The contact semiconductor layer, and any other intermediate layers, should therefore be removed where the back surface reflector is to be attached to the back surface. As such, the method proceeds to 486 with exposing the back surface confinement layer in the one or more regions by selectively removing the contact semiconductor layer from the one or more regions, and to 488 with depositing the back surface reflector layer where the back surface confinement layer is exposed in the one or more regions.

For any of the embodiments described herein, the back surface reflector layer may comprise a multilayer stack of thin film dielectric layers configured to provide a highly reflective surface for reflecting photons back into the device.

In one embodiment, depositing the contact semiconductor layer onto the back surface reflector layer may optionally include applying a conductive stop etch material onto the back surface of the back surface confinement layer, and then depositing the contact semiconductor layer onto the stop etch material. Exposing the back surface confinement layer at 486 may then further comprise applying a first selective etchant solution to dissolve the contact layer from the one of more regions down to the conductive stop etch material, and applying a second selective etchant solution to dissolve the conductive stop etch material down to the back surface confinement layer. It should be appreciated that a similar process using intermediate layers 415 may be utilized to fabricate a pattern of front side contacts 416 which are applied to the front side confinement layer surface.

Figure 4E:
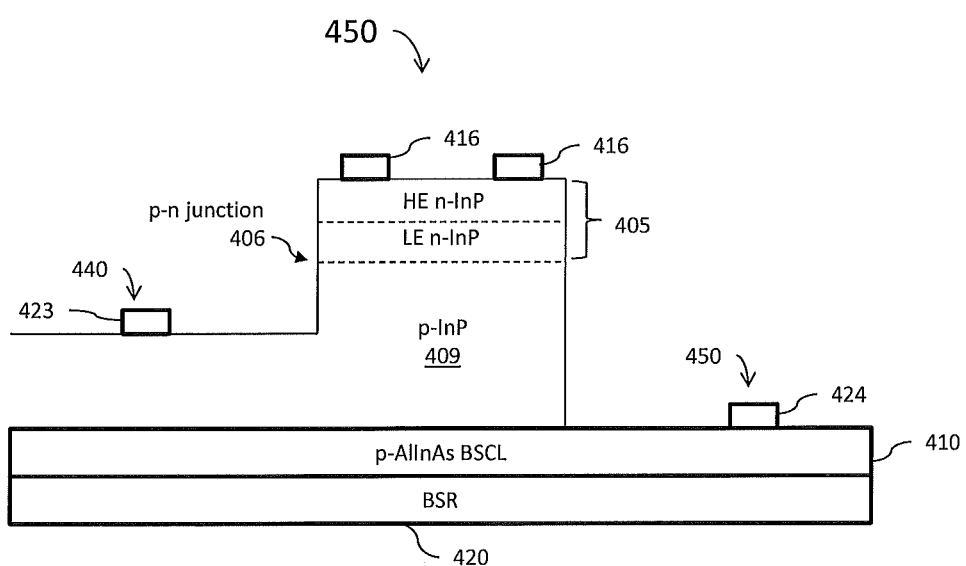
FIG. 4e is a block diagram illustrating a general schematic structure for an InP solar cell of an example embodiment of the present disclosure.

In one alternative embodiment, instead of having ohmic contacts provided by a metallization layer 414 applied to the backside of device 400 (such as shown in FIGS. 4a and 4b), front side accessible contacts, such as contact 423 and/or contact 424 as shown in FIG. 4e for example, are provided. Such a configuration may provide for a more continuous BSR 420 across BSCL 410. In one embodiment (shown generally at 440), a front-side accessible contact 423 could be fabricated to electrically couple to the p-type region at a plateau below the n-p junction 406 mesa. In another embodiment (shown generally at 450), a portion of the BSCL 410 may be exposed and accessible from the front side of device 400 such that a front-side accessible contact 424 could be fabricated on BSCL 410. In such an embodiment, BSCL 410 would provide further functionality as a contact layer and as a lateral conductor layer (LCL).

Figure 5:
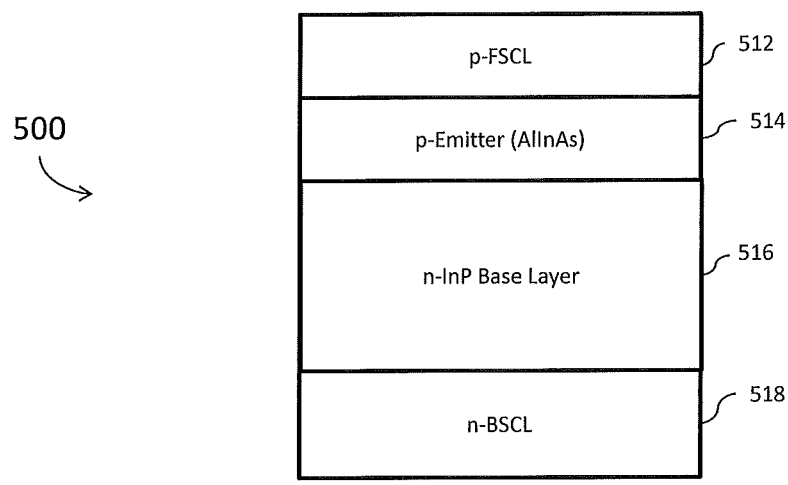
FIG. 5 is a block diagram illustrating a general schematic structure for an InP solar cell of an example embodiment of the present disclosure.

In still other embodiments, a p-n heterojunction cell structure may be used such as shown in FIG. 5. In FIG. 5, a InP heterojunction solar cell 500 structure comprises an InP base layer 516 and BSCL 518, and a FSCL 512, but as opposed to an InP emitter, the emitter layer 514 comprises an appropriate material with a higher band gap to create a p-n heterojunction cell structure. For example, in one embodiment, solar cell 500 comprises lattice matched AlInAs/InP cell structure with a p-AlInAs layer 514 substituting for the p-InP emitter layer 114 shown in FIG. 1b. Note that the metallurgical p-n junction for solar cell 500 may not necessarily be coincident with the location of the AlInAs/InP heterojunction. In this embodiment, the FSCL 512 would form part of a heterointerface system architecture while BSCL 518 would form part of a High-Low (HL) doping architecture.

Examples of Embodiments Reduced to Practice

Figure 6:
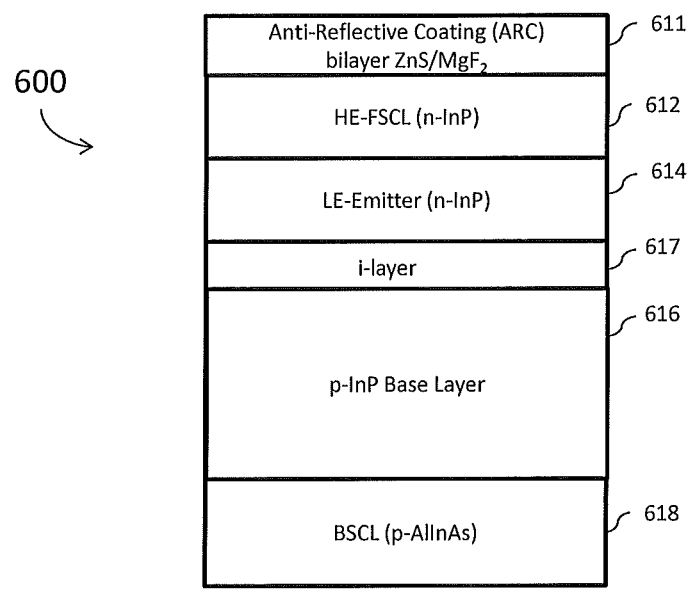
FIG. 6 is a block diagram illustrating a general schematic structure for an InP solar cell of an example embodiment of the present disclosure.

In one embodiment, an upright-grown, n-on-p embodiment of a solar cell such as solar cell 110 successfully yielded a new world-record for one-sun solar conversion efficiencies for InP solar cells. Illustrated in FIG. 6, the cell structure 600 used an HL doping profile (S doping) with the emitter layer 614 to form a front-surface confinement, as described earlier. The nominal thicknesses and doping levels for the HE layer 612 were 7 nm and $2\times10^{19}$ cm$^{-3}$, and for the LE layer 614, 0.2 µm and $8\times10^{16}$ cm$^{-3}$, respectively. Lattice-matched AlInAs was used at the back of the p-InP base layer 616 to affect a back-surface confinement layer 618 that was grown to a thickness of ~0.1 µm. The p-InP base layer 616 was grown to a thickness of ~5 µm and doped to ~$5\times10^{16}$ cm$^{-3}$ with Zn. A doping interrupt i-layer 617 (i.e., with no intentional doping) between the emitter layer 614 and base layer 616 was also included and grown to a thickness of 0.01 µm. Theses cell structures were grown on (Zn) p$^+$-InP parent growth substrates doped to about $3\times10^{18}$ cm$^{-3}$. The cells were processed using conventional techniques in a clean room. The process further included depositing a bilayer ZnS/MgF$_2$ ARC 611. The ARC 611 layer used for these laboratory-produced cells was not considered fully optimized, thus leaving room for additional performance improvement.

Figure 7:
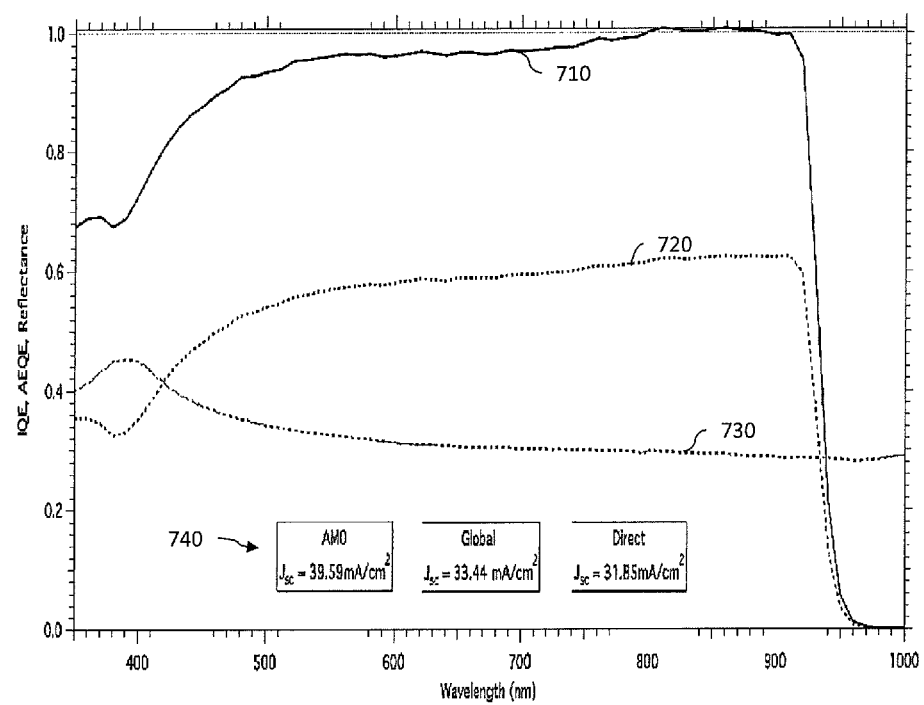
FIG. 7 is a chart illustrating a graph of composite spectral internal quantum efficiency (IQE), absolute external quantum efficiency (AEQE), and reflectance data for an InP solar cell of an example embodiment of the present disclosure.

Results for the InP cell 600 with dual minority-carrier confinement as described above are provided herein. Composite spectral quantum efficiency (QE) and reflectance (R) data for the cell are shown in FIG. 7. FIG. 7 presents a graph of composite spectral internal quantum efficiency (IQE) 710, absolute external quantum efficiency (AEQE) 720, and reflectance data 730. The short-circuit current densities ($J_{sc}$) determined by spectrally integrating the IQE with the photon flux for each reference spectrum are shown generally at 740. The spectral IQE data were calculated according the following formula:

$$IQE(\lambda)=AEQE(\lambda)/\{(1-C)\times[1-R(\lambda)]\}$$

In the formula, $\lambda$ is the wavelength, $AEQE(\lambda)$ is the measured spectral absolute external quantum efficiency, C is the measured front-surface metallization fractional coverage (i.e., grid finger width divided by the grid finger spacing), and $R(\lambda)$ is the measured spectral reflectance. The spectral IQE data for the cell structure 600 gives us keen insight regarding internal loss mechanisms and is also useful for estimating the eventual performance of completed cells with ARCs under a given reference spectrum. The IQE data in FIG. 7 shows that the internal collection of photogenerated carriers is excellent. From 800 nm (the optical gap of the Moss-Burstein shifted HE layer) out to the band edge of the p-InP base layer (~930 nm) the collection is essentially perfect.

That is, as shown by the IQE 710 data, just about every photon in the wavelength range of about 800 nm to 920 nm that enters the cell is collected without loss. The AlInAs back-surface confinement layer 618 is doing a near perfect job keeping carriers from recombining at the back of the p-InP base layer. The data indicates that nearly all carriers being generated most deeply in the cell are being collected by the p-n junction. This implies that non-radiative recombination at back edge of InP solar cell 600 is extremely low.

The internal losses shown for shorter wavelengths (less than about 800 nm) are a result of carriers generated in the HE layer 612 that recombine quickly and non-radiatively due to Auger recombination in the bulk and defect recombination at the surface. That is, when using the HL doping scheme at the front surface, one consequence is that the HE layer 612, though very thin, has a high non-radiative recombination rate due to the abovementioned mechanisms, thus for any light absorbed in the highly doped HE layer 612, the carriers generated are immediately lost. Due to degenerate doping, the HE layer 612 is essentially transparent in the 800 nm to 920 nm range so that light in that range can pass through to the more lightly doped layers where the carriers are collected. The absorption coefficient in HE layer 612, however, gets stronger towards the shorter wavelengths, so there is an increasingly larger fraction of photons that gets absorbed by HE layer 612 for wavelengths shorter than about 800 nm. It should be noted that the IQE data can be used to calculate potential photocurrent data for the cell 600 under given solar reference spectra.

Figure 8:
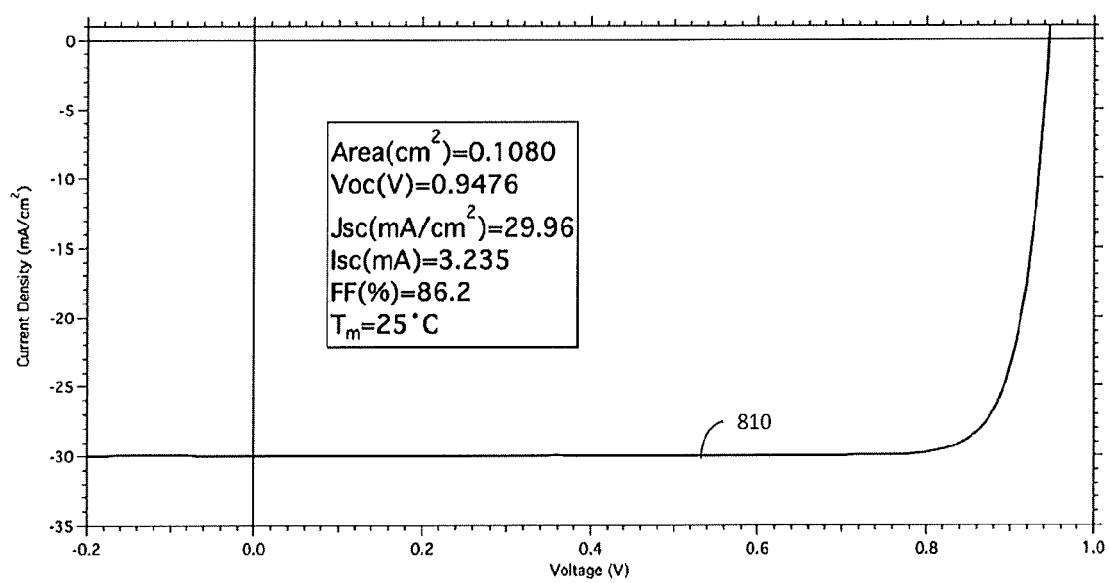
FIG. 8 is a chart illustrating illuminated current density versus voltage for an InP solar cell of an example embodiment of the present disclosure.

Illuminated current density as a function of voltage (IJV) data for the cell 600 under an arbitrary intensity close to one-sun are shown in FIG. 8. The cell does not have an ARC applied to it. In particular, FIG. 8 illustrates at 810 the illuminated current density versus voltage measured at 25° C. Such data are very useful in that they can be used in conjunction with the spectral IQE data as a basis for projecting the potential performance of a cell, such as solar cell 800, under well-defined reference solar spectra.

Cell performance projections for the global and AM0 reference spectra (shown near the bottom of table 2 below) used the $J_{sc}$ values shown in FIG. 7 de-rated by 0.95 to account for grid and reflectance losses for real cells with an ARC. The projected $V_{oc}$ and FF values were based on the measured values at an arbitrary illumination intensity shown in FIG. 8 and the $V_{oc}$ values were then corrected (assuming unity diode ideality) using the de-rated $J_{sc}$ values.

Official PV performance results confirmed by NREL for completed InP cells with actual ARCs have also been obtained. Both confirmed and projected results are summarized in Table 2 along with previous record results achieved for InP cells for comparison. In particular, Table 2 provides various one-sun PV performance data for InP solar cells operating at 25° C. The previous world-record (PWR) data for cells are listed as a reference point for comparison to the new NREL record results and projected performance levels.

TABLE 2

| Origin | Spectrum | $V_{oc}$ (V) | $J_{sc}$ (mAcm$^{-2}$) | FF (%) | Eff. (%) |
|---|---|---|---|---|---|
| PWR | Global | 0.878 | 29.5 | 85.4 | 22.1 |
| NREL (new record) | Global | 0.939 | 31.2 | 82.6 | 24.2 |
| NREL (new record) | AM0 | 0.943 | 37.1 | 82.1 | 21.1 |
| NREL (IQE projected) | Global | 0.949 | 31.8 | 86.2 | 26.0 |
| NREL (IQE projected) | AM0 | 0.953 | 37.6 | 86.2 | 22.6 |

Figure 9A:
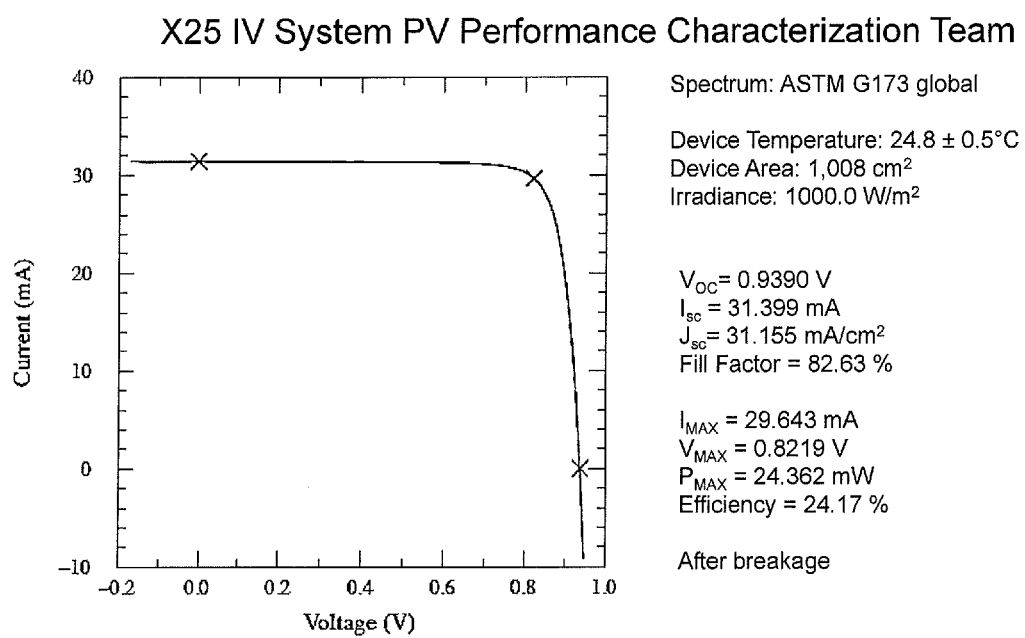
FIGS. 9a and 9b are performance characterization plots for example embodiments of the present disclosure.
Figure 9B:
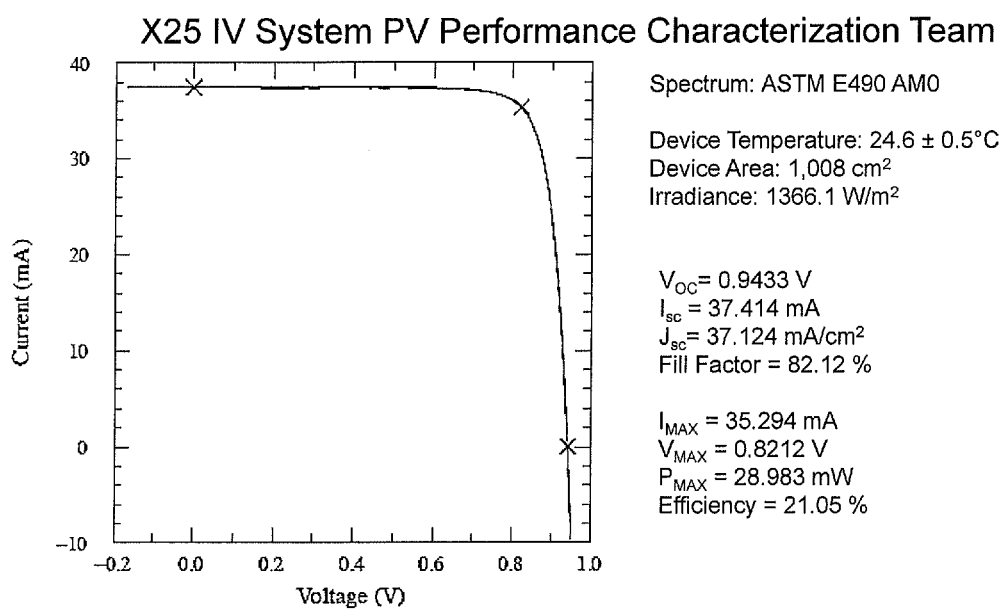

When compared to the PWR results, the new record results for the InP cells described in the present disclosure represent a significant leap in performance. The official record InP cell efficiency IJV plots (global and AM0) are shown respectively in FIGS. 9a and 9b. Significant gains have been realized for both $J_{sc}$ (5.8%) and $V_{oc}$ (6.9%). It should be noted that the gain in $J_{sc}$ is largely due to an improved IQE resulting from the HL doping scheme in the emitter, while the gain in $V_{oc}$ is largely due to the application of the AlInAs BSCL. It should also be noted that the bilayer ARC (ZnS/MgF$_2$) used on experimental cells has degraded the fill factor (FF) of the cells, which has limited their efficiency. $V_{oc}$ may also have been slightly impacted. Without FF degradation, the cell efficiency will exceed 25% under the global reference spectrum, as corroborated by the projected results shown in Table 2, and are equivalent to the best for conventional GaAs solar cells.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

I claim:

1. A photovoltaic device comprising:
  a High-Low (HL) doping architecture comprising a front surface confinement layer and an emitter layer; and
  a heterointerface system architecture comprising a back surface confinement layer and a base layer, wherein:
  the emitter layer and the base layer form a p-n junction absorber layer,
  at least one of the emitter layer or the base layer comprises InP, and the front surface confinement layer comprises n-type InP and has a thickness of 7 nm or less.

2. The device of claim 1, wherein the p-n junction absorber layer includes a homojunction, and both the emitter layer and the base layer comprise InP.

3. The device of claim 1, wherein the p-n junction absorber layer includes a heterojunction.

4. The device of claim 1, wherein:
the emitter layer comprises n-type InP and is more lightly doped than the front surface confinement layer, and
a recombination rate is radiatively dominated in the emitter layer.

5. The device of claim 4, wherein the front surface confinement layer is doped degenerately.

6. The device of claim 1, wherein the at least one of the back surface confinement layer or the base layer comprises p-type InP.

7. The device of claim 1, wherein the base layer comprises p-type InP, and the back surface confinement layer comprises one of: GaAsSb, AlAsSb, AlGaAsSb, AlInAs, AlInAsSb, AlGaInAsSb, GaPSb, AlPSb, or AlGaPSb.

8. The device of claim 1, wherein the device has an ultra-thin cell structure.

9. The device of claim 1, further comprising a back surface reflector layer formed on the back surface confinement layer.

10. The device of claim 9, wherein the back surface reflector layer comprises one of:
a hybrid multi-layer-dielectric with a metal reflector;
an omnidirectional reflector (ODR) comprising a dielectric layer and a metal layer; or
a broad-band high-low index distributed Bragg reflector (DBR) with high reflectance.

11. The device of claim 9, further comprising:
a contact layer electrically coupled to the back surface confinement layer; and
a metallization layer electrically coupled to the contact layer.

12. The device of claim 9, further comprising a metallization layer electrically coupled to the base layer.

13. The device of claim 1, wherein the at least one of the emitter layer or the base layer comprises a pseudo-binary alloy of InP containing up to 5% of at least one of Boron (B), Nitrogen (N), Aluminum (Al), Phosphorous (P), Gallium (Ga), Arsenic (As), Antimony (Sb), Indium (In), Thallium (Tl), or Bismuth (Bi).

* * * * *